(12) United States Patent
Yamamoto et al.

(10) Patent No.: US 7,993,699 B2
(45) Date of Patent: Aug. 9, 2011

(54) PROCESS FOR PRODUCING METALLIZED ALUMINUM NITRIDE SUBSTRATE

(75) Inventors: Yasuyuki Yamamoto, Shunan (JP); Masakatsu Maeda, Shunan (JP)

(73) Assignee: Tokuyama Corporation (JP)

( * ) Notice: Subject to any disclaimer, the term of this patent is extended or adjusted under 35 U.S.C. 154(b) by 196 days.

(21) Appl. No.: 11/667,603

(22) PCT Filed: Nov. 10, 2005

(86) PCT No.: PCT/JP2005/020649
§ 371 (c)(1),
(2), (4) Date: May 11, 2007

(87) PCT Pub. No.: WO2006/051881
PCT Pub. Date: May 18, 2006

(65) Prior Publication Data
US 2008/0020224 A1    Jan. 24, 2008

(30) Foreign Application Priority Data

Nov. 12, 2004 (JP) ................................. 2004-328778

(51) Int. Cl.
*B05D 5/12* (2006.01)
*B05D 3/00* (2006.01)

(52) U.S. Cl. .......... 427/58; 427/189; 427/190; 427/191; 427/192; 427/383.1

(58) Field of Classification Search .................... 427/58, 427/189–192, 383.1
See application file for complete search history.

(56) References Cited

U.S. PATENT DOCUMENTS

| | | | | |
|---|---|---|---|---|
| 4,883,704 A | * | 11/1989 | Sato et al. | 428/209 |
| 5,010,388 A | * | 4/1991 | Sasame et al. | 257/669 |
| 5,063,121 A | | 11/1991 | Sato et al. | |
| 5,165,983 A | | 11/1992 | Sugiura et al. | |
| 5,529,852 A | * | 6/1996 | Sasame et al. | 428/620 |
| 5,656,113 A | * | 8/1997 | Ikeda et al. | 156/89.15 |
| 5,763,093 A | * | 6/1998 | Casey et al. | 428/469 |
| 5,856,028 A | * | 1/1999 | Thimm | 428/627 |
| 6,174,614 B1 | * | 1/2001 | Yushio et al. | 428/698 |
| 6,294,275 B1 | * | 9/2001 | Natsuhara et al. | 428/698 |
| 7,622,203 B2 | | 11/2009 | Itoh et al. | |

FOREIGN PATENT DOCUMENTS

| | | |
|---|---|---|
| EP | 0913371 A2 | 5/1999 |
| JP | 61117161 A | 6/1986 |
| JP | 02018371 A | 1/1990 |
| JP | 5283272 A | 10/1993 |

(Continued)

*Primary Examiner* — Brian K Talbot
(74) *Attorney, Agent, or Firm* — The Webb Law Firm

(57) ABSTRACT

A metallized aluminum substrate for mounting a semiconductor device such as LD or LED is provided and a metallized aluminum nitride substrate having excellent dimensional accuracy and high bonding strength of a wiring pattern. An intermediate material substrate is provided, comprising a sintered aluminum nitride substrate having on its surface a wiring pattern constituted of a conductor layer composed of a composition containing at least high-melting point metal powder, aluminum nitride powder and a sintering auxiliary agent for aluminum nitride is prepared. Then, the intermediate material substrate is fired while the sintered aluminum nitride obtained by sintering using a sintering auxiliary agent of the same kind as that of the sintering auxiliary agent contained in the composition is placed so as to be brought into contact with the conductor layer on the surface of the intermediate material substrate or so as to be present in the vicinity of the conductor layer.

8 Claims, 6 Drawing Sheets

FOREIGN PATENT DOCUMENTS

| | | |
|---|---|---|
| JP | 8034686 A | 2/1996 |
| JP | 8239286 A | 9/1996 |
| JP | 2000124566 A | 4/2000 |
| JP | 2002179467 A | 6/2002 |
| JP | 2003342089 A | 12/2003 |
| JP | 2004075429 A | 3/2004 |
| KR | 1019900006680 B1 | 9/1990 |

* cited by examiner

[Fig.1]
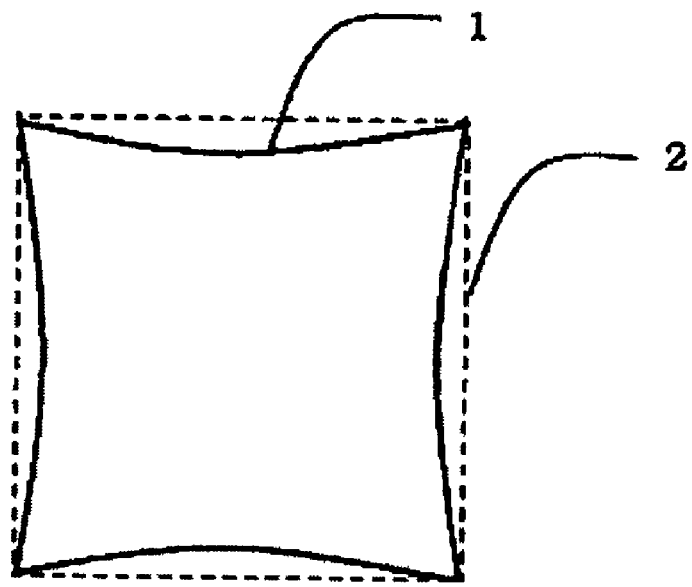
[Fig.2]
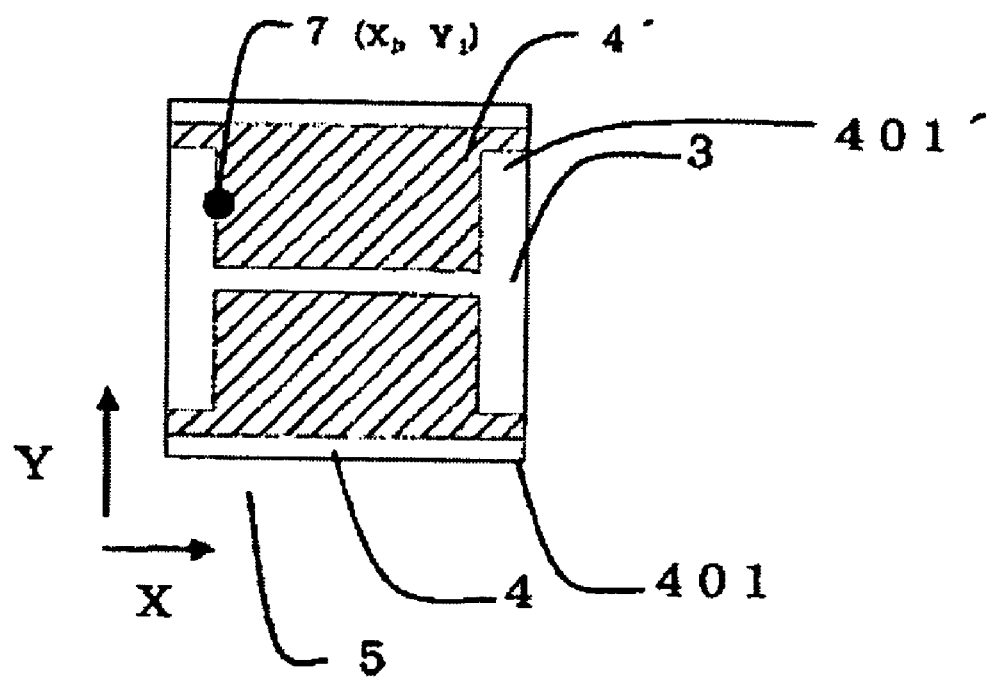

[Fig.3]
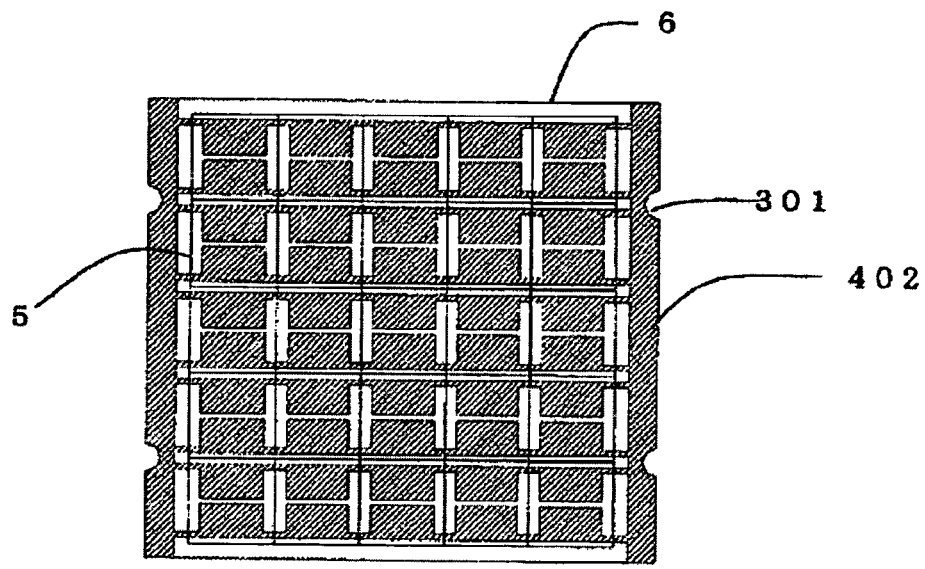
[Fig.4]
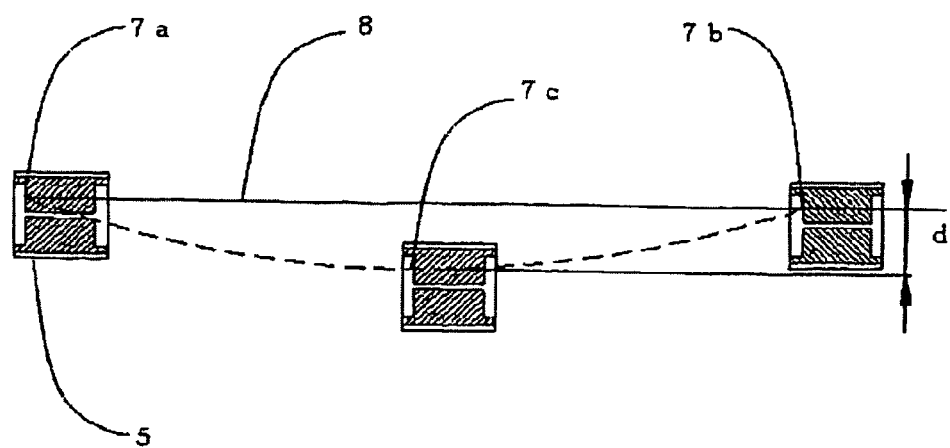

[Fig.5]
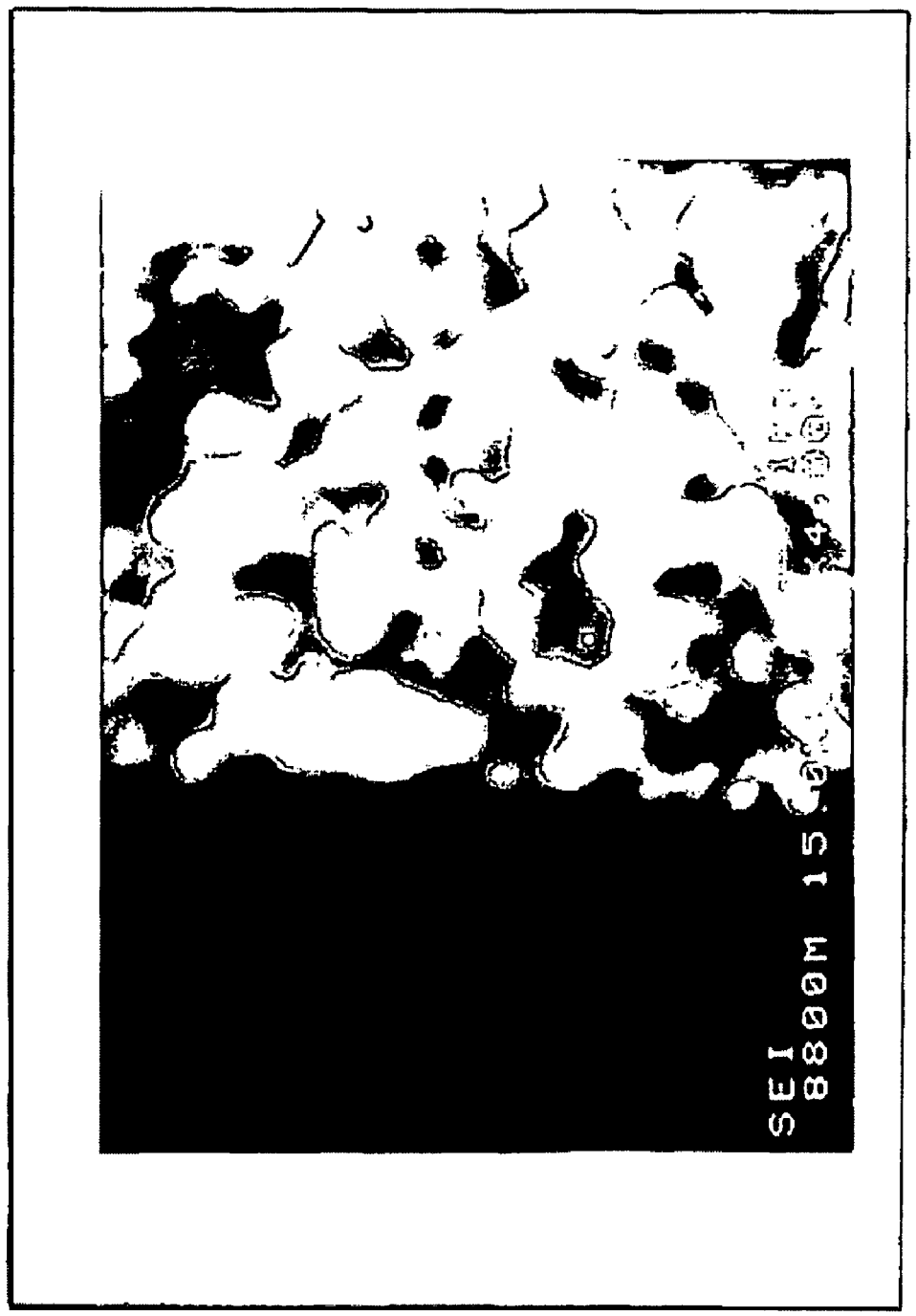

[Fig.6]
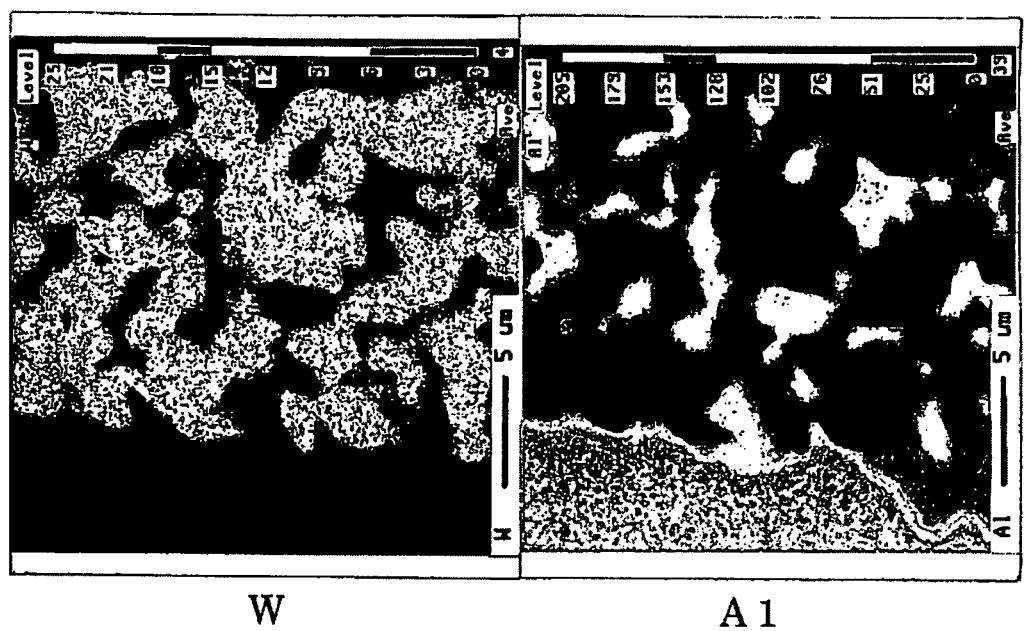
W        Al

[Fig.7]
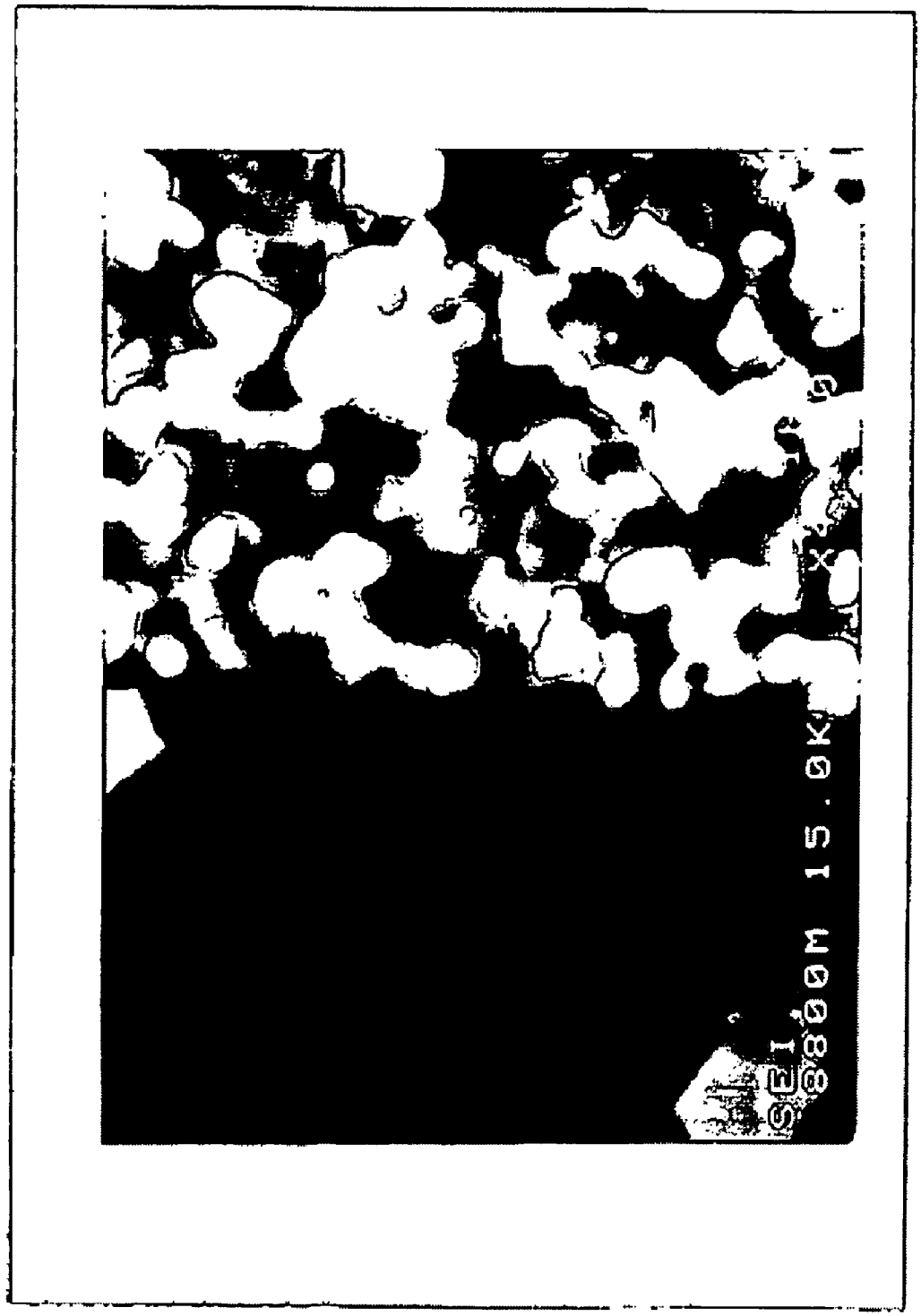

[Fig.8]
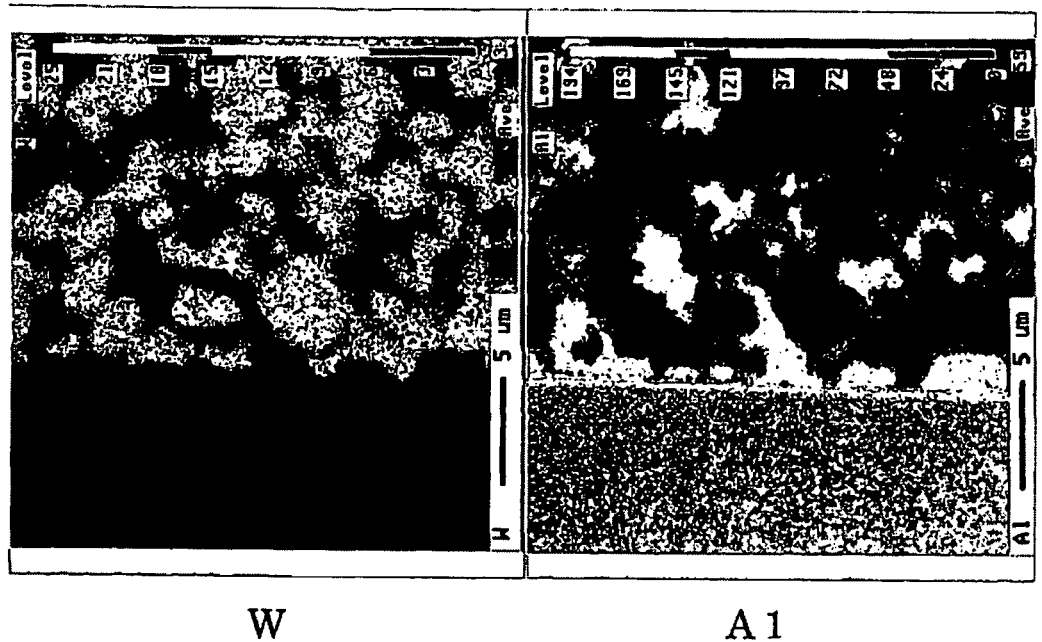

PROCESS FOR PRODUCING METALLIZED ALUMINUM NITRIDE SUBSTRATE

TECHNICAL FIELD

The present invention relates to a metallized aluminum nitride substrate that is preferably employable as a sub-mount for mounting a semiconductor device containing a light emission element such as light emitting diode (LED) or laser diode and a process for producing the substrate.

BACKGROUND ART

In recent years, the trend of higher output power of semiconductor devices such as laser diode device (referred to as "LD" hereinafter) and light emitting diode device (referred to as "LED" hereinafter) is shown. With such trend, there occurs a problem that heat generation from the devices is increased to shorten the lifetime of the devices. To solve such a problem, aluminum nitride substrates having high heat dissipation property have come to be used as the substrates for device mounting.

In the use of the aluminum nitride substrate for device mounting, it is necessary to form an electrode or a wiring on the substrate surface in order to bond the device or supply electric power to the bonded device. Formation of the electrode or the wiring is carried out by forming a conductor layer that is designed so as to have a prescribed shape on the substrate surface using so-called metallization technique. As the metallization technique generally used in this case, a co-fire process or a post-fire process is known.

The co-fire process is a process comprising printing a metallizing paste containing a high-melting point metal in a shape of a prescribed pattern on a surface of an aluminum nitride green sheet, then firing the green sheet and the paste at the same time to bond the high-melting point metal to the substrate surface, and then if necessary, forming another metal layer thereon by plating or the like (see patent documents 1 and 2). The post-fire process is a process comprising printing a metallizing paste in a shape of a prescribed pattern on a sintered aluminum nitride substrate having been previously fired, then baking the paste to bond the high-melting point metal layer to the substrate surface, and then if necessary, forming another metal layer thereon by plating or the like (see patent document 3).

On the other hand, the substrate for mounting LD or LED generally has an extremely small size (e.g., 3 mm×3 mm), and for producing such a substrate, it is general from the viewpoint of production efficiency to adopt a process comprising forming a wiring pattern, in which a large number of "wiring patterns of individual substrates for device mounting" (also referred to as "wiring pattern units" hereinafter) are orderly arranged, on a surface of a multiple-piece-forming substrate of a large size and then cutting the substrate along boundaries of the wiring pattern units (said process being also referred to as a "multiple-piece-forming process" hereinafter) (see patent document 4). In this multiple-piece-forming process, many substrates can be produced at a time by regularly arranging the wiring pattern units in the form of a lattice and by cutting the substrate along the longitudinal and lateral boundaries that are both linear lines.

The co-fire process has an excellent feature that the high-melting point metal layer can be bonded to the substrate surface with a relatively high adhesion strength, but in the case where the multiple-piece-forming process is adopted, such non-uniform shrinkage of the substrate as shown in FIG. 1 takes place in the sintering step, and it is difficult to control dimensional accuracy. Hence, there occurs a problem that the yield cannot be increased. That is to say, in the multiple-piece-forming process, it is preferable from the viewpoint of production efficiency to densely arrange as many wiring pattern units as possible on a large substrate. In the co-fire process, however, the substrate is deformed into a shape of a star as shown in FIG. 1, so that when a large substrate is used, (i) a wiring pattern unit arranged in the vicinity of the circumference of the substrate suffers change in shape of the wiring pattern, and besides, (ii) even if the wiring pattern units are orderly arranged in the form of a lattice before sintering, rows of the wiring pattern units are curved after sintering. In the case where the substrate is cut linearly, therefore, some wiring pattern units pass over the boundary region, and the wiring pattern is damaged. In FIG. 1, the shape of a substrate 2 before firing (sintering) is indicated by a dotted line, and the shape of a substrate 1 after firing (sintering) is indicated by a solid line.

Although means to solve the above problem have been proposed, but control of dimensional accuracy to a satisfactory level has not been achieved yet. For example, there has been proposed as such a means in which to a part of an outer surface of a substrate, a pressure or a force of constraint of such a range that sintering shrinkage of the surface is not substantially brought about is applied in the firing step, and at the same time, a magnitude of creep occurring on the material is controlled to compensate firing shrinkage of a surface (free surface) of the sintering product to which a pressure and/or a force of constraint has not been applied, whereby the final outer shape of the sintering product is controlled (see patent document 5). However, even if such a special means is taken, realization of dimensional accuracy of about ±50 μm is the limitation in the region of about 50 mm square (50 mm×50 mm, referred to as "☐50 mm" hereinafter), and in the region of about ☐100 mm, realization of dimensional accuracy of about ±100 μm is the limitation ("☐" represents a square).

In the post-fire process, the metallizing paste is printed on the previously sintered substrate and then baked, so that shrinkage of the substrate does not take place in the baking step and the aforesaid problem of dimensional accuracy dose not occur. However, the bonding strength of the high-melting point metal layer formed on the sintered aluminum nitride surface in the post-fire process is not necessarily sufficient. For example, the aforesaid patent document 3 discloses technique of adding a specific component to the high-melting point metal paste to increase a bonding strength of the metallization layer, but the bonding strength is about 2 to 4 kg/mm$^2$.

Patent document 1: Japanese Patent Laid-open Publication No. 2003-342089

Patent document 2: Japanese Patent Laid-open Publication No. 2003-179467

Patent document 3: Japanese Patent Laid-open Publication No. H8-34686

Patent document 4: Japanese Patent Laid-open Publication No. H8-239286

Patent document 5: Japanese Patent Laid-open Publication No. H5-283272.

As described above, there has not been known so far a multiple-piece-forming metallized substrate which is used for producing metallized aluminum nitride substrates preferably used as, for example, substrates for mounting LD or LED, is excellent in dimensional accuracy of wiring pattern units themselves and arrangement thereof and has a high bonding strength of a wiring pattern.

Therefore, it is an object of the present invention to provide a metallized aluminum nitride substrate satisfying such requirements as mentioned above.

SUMMARY OF THE INVENTION

The present inventors have considered that the above problem can be solved by increasing the bonding strength between the high-melting point metal layer and the substrate in the post-fire process, and as a means to solve the problem, they have hit upon an idea that by the addition of aluminum nitride powders to the high-melting point metal paste, sintering of aluminum nitride in the conductor layer is accelerated in the firing step to thereby unite the aluminum nitride that constitutes the substrate and the aluminum nitride dispersed in the conductive layer in a body, whereby the sintered substrate and the conductor layer are firmly bonded. Based on this idea, the present inventors have earnestly studied, and as a result, they have found that in the case where a sintering auxiliary agent is further added to the high-melting point metal paste and firing is carried out while placing an "aluminum nitride substrate having been sintered using a sintering auxiliary agent of the same kind as that of the above sintering auxiliary agent" on the pattern (layer) composed of the high-melting point metal paste, the aluminum nitride dispersed in the metallization layer and the aluminum nitride of the substrate can be sintered together, whereby the bonding strength of the high-melting point metal layer can be remarkably enhanced. Based on the finding, the present invention has been accomplished.

That is to say, the first embodiment of the invention is a process for producing a metallized aluminum nitride substrate, comprising an intermediate material substrate preparation step for preparing a sintered aluminum nitride substrate having on its surface a layer composed of a composition comprising at least one kind of high-melting point metal powder selected from the group consisting of tungsten powders and molybdenum powders, aluminum nitride powders and a sintering auxiliary agent for aluminum nitride, and a firing step for firing the substrate prepared in the previous step to sinter the layer, wherein in the firing step, firing is carried out with inhibiting volatilization of the sintering auxiliary agent contained in the composition. The second invention is a metallized aluminum nitride substrate obtained by the production process of the invention.

In the production process of the invention, a special interfacial structure in which the aluminum nitride in the conductor layer and the aluminum nitride of the substrate are united in a body can be realized (described later in detail) in spite that the post-fire process is adopted, a metallization layer bonded to the substrate with a high bonding strength (e.g., not less than 50 MPa, preferably not less than 70 MPa) that cannot be obtained by the conventional post-fire process can be formed, and airtight property of not more than $5 \times 10^{-9}$ Pa·m$^3$/s can be secured in the helium leakage test (JIS Z 2331). On this account, addition of an active metal, such as Ti, Zr or Hf, to the high-melting point metal in order to increase the bonding strength is unnecessary. It is known that such an interfacial structure as mentioned above is obtained when the co-fire process is used, but a report that such an interfacial structure was obtained in the post-fire process does not exist as far as the present inventors know.

Although the reason why such an interfacial structure as described above is obtained by the production process of the invention is not clear, the present inventors have presumed as follows. That is to say, it is presumed that in the production process of the invention, for example, a "sintered aluminum nitride containing a sintering auxiliary agent" is placed in the vicinity of an exposed surface of the conductor layer, whereby the sintering auxiliary agent is volatilized from the sintered aluminum nitride in the firing step to control the atmosphere so as to raise a partial pressure of the sintering auxiliary agent in the vicinity of the conductor layer. On this account, the sintering auxiliary agent component contained in the conductor layer is inhibited from volatilization and going outside in the firing step, so that a satisfactory liquid phase is formed inside the conductor layer, and consequently, the aluminum nitride in the conductor layer and the sintered aluminum nitride substrate can be sintered together. Such an effect of inhibiting volatilization of a sintering auxiliary agent is conspicuously observed when a sintering auxiliary agent having high volatility at the firing temperature, such as calcium oxide, is used, but also when a sintering auxiliary agent having low volatility, such as yttrium oxide, is used, the above effect is exhibited, and this serves to accelerate sintering of aluminum nitride and grain growth in the complicated sintering mechanism.

Further, by forming the liquid phase in the conductor layer, the high-melting point metal in the conductor layer is apt to become more dense, and the conductor layer also becomes strong and stiff, so that the electrical conductivity of the conductor layer can be raised.

According to the production process of the invention, the bonding strength equivalent to that obtained by the co-fire process can be obtained with maintaining an advantage of the post-fire process that deformation of the substrate does not occur, as described above. On this account, the present invention also provides, the following substrate that is useful as a multiple-piece-forming substrate.

That is to say, the invention also provides a metallized aluminum nitride substrate having on its surface a wiring pattern having one or more rows arranged, in each of said rows 5 or more wiring pattern units of substantially the same shapes being orderly arranged in one direction, wherein:

(1) the wiring pattern comprises a conductor layer which includes a high-melting point metal layer comprising at least one high-melting point metal selected from the group consisting of tungsten and molybdenum, and sintered aluminum nitride and is bonded to the sintered aluminum nitride substrate with the high-melting point metal layer, (2) the conductor layer is bonded to the sintered aluminum nitride substrate with a bonding strength of not less than 50 MPa (5.1 kgf/mm$^2$), and (3) the wiring pattern has a pattern array tolerance, as defined below, of not more than 10 μm.

The "pattern array tolerance" used herein means a maximum value of the shortest distances between reference points of wiring pattern units and a reference line, said maximum value being obtained by deciding one arbitrary point present inside a wiring pattern unit as a reference point, then taking, as a reference line, a linear line between reference points of wiring pattern units located at both ends of each row of all the "rows in each of which 5 or more wiring pattern units are orderly arranged" present on a substrate, then determining the shortest distance between the reference points of each wiring pattern unit of all the wiring pattern units belonging to each row and the reference line, and finding a maximum value of the shortest distance.

Further, the present invention also provides, as the fourth invention, a process for producing a substrate chip, characterized by comprising cutting the metallized aluminum nitride substrate of the third invention along boundaries of the wiring pattern units to produce a metallized substrate chip having one wiring pattern unit on the surface.

According to the production process of the invention, a wiring pattern having a bonding strength that has not been obtained so far can be formed by the post-fire process, and besides, even in case of a multiple-piece-forming substrate, preparation of a wiring board having high dimensional accuracy of arrangement (small pattern array tolerance) becomes possible.

BRIEF DESCRIPTION OF THE DRAWINGS

FIG. 1 is a view schematically showing deformation of a substrate in the co-fire process;
FIG. 2 is a view showing a typical wiring pattern unit;
FIG. 3 is a top plan view of a typical intermediate material substrate used in the production process of the invention;
FIG. 4 is a schematic view to explain a pattern array tolerance;
FIG. 5 is a SEM photograph of a section of a metallized substrate obtained in Example 1, in the vicinity of a bonding interface between a metallization layer and a substrate;
FIG. 6 is a group of mapping images of W and Al by EPMA on a section of a metallized substrate obtained in Example 1, in the vicinity of a bonding interface between a metallization layer and a substrate;
FIG. 7 is a SEM photograph of a section of a metallized substrate obtained in Comparative Example 2, in the vicinity of a bonding interface between a metallization layer and a substrate; and
FIG. 8 is a group of mapping images of W and Al by EPMA on a section of a metallized substrate obtained in Comparative Example 2, in the vicinity of a bonding interface between a metallization layer and a substrate.

BEST MODE FOR CARRYING OUT THE INVENTION

The process for producing a metallized aluminum nitride substrate according to the invention comprises an intermediate material substrate preparation step for preparing a sintered aluminum nitride substrate (also referred to as an "intermediate material substrate" simply hereinafter) having on its surface a layer (also referred to as an "unfired conductor layer") composed of a composition at least containing at least one kind of high-melting point metal powder selected from the group consisting of tungsten powders and molybdenum powders, aluminum nitride powders and a sintering auxiliary agent for aluminum nitride; and a firing step for firing in the step the prepared substrate to sinter the unfired conductor layer. (The conductor layer having been sintered is also referred to as a "sintered conductor layer" hereinafter.)

In the intermediate material substrate preparation step, a sintered aluminum nitride substrate and a composition at least containing at least one kind of high-melting point metal powder selected from the group consisting of tungsten powders and a molybdenum powder, aluminum nitride powders and a sintering auxiliary agent for aluminum nitride are prepared first. Then, the composition is made, for example, pasty and applied onto a surface of the sintered aluminum nitride substrate by a printing method to form a prescribed pattern (wiring pattern that becomes electrode or wiring part), thereafter the pattern is dried, and then the pattern is degreased when needed, whereby an intermediate material substrate can be obtained.

The sintered aluminum nitride substrate is not specifically restricted provided that it is a substrate composed of sintered aluminum nitride. However, the heat conductivity of the sintered aluminum nitride substrate is preferably higher, so that it is preferable to use a sintered aluminum nitride substrate having a heat conductivity of, for example, not less than 170 W/m·K. The shape and the size of the substrate are properly determined according to the desired substrate. The sintered aluminum nitride substrate does not particularly differ from a substrate used in the conventional post-fire process, and examples of such substrates include (i) a substrate obtained by cutting a green sheet containing aluminum nitride powders into a nearly square shape, then processed such as through-hole formation or laminated when needed and then sintered, (ii) a sintered substrate prepared by the co-fire process and having a tungsten via hole and an inner layer wiring, and (iii) a substrate obtained by subjecting the substrate (i) or (ii) to treatment of grinding, polishing, perforation or the like. In general, aluminum nitride is hardly sintered, so that in order to sinter it, a sintering auxiliary agent is employed. As the sintering auxiliary agent, compounds which are generally used as sintering auxiliary agents for aluminum nitride and contain rare earth elements or alkaline earth elements, such as yttrium oxide, calcium oxide, calcium carbonate, calcium phosphate and $3CaO.Al_2O_3$, are employable without any specific restriction. From the viewpoint of sinterability, however, it is preferable to use compounds containing Y element, such as yttrium oxide. The amount of the sintering auxiliary agent used is preferably in the range of 1 to 20 parts by weight, particularly 3 to 10 parts by weight, based on 100 parts by weight of the aluminum nitride powder.

As the sintered aluminum nitride substrate, sintered aluminum nitride containing no sintering auxiliary agent, which is obtained by, for example, hot pressing, is also employable.

The unfired conductor layer formed on a surface of the aluminum nitride substrate needs to be composed of a composition at least containing at least one kind of high-melting point metal powder selected from the group consisting of tungsten powders and molybdenum powders, aluminum nitride powders and a sintering auxiliary agent for aluminum nitride. In the case where the metal powders contained in the composition are metal powders other than tungsten powders or molybdenum powders, the sintering temperature cannot be raised because the metal has a low melting point, so that the aluminum nitride contained in the composition cannot be sintered in the firing step, and as a result, satisfactory bonding strength cannot be obtained. In the case where the composition contains no aluminum nitride powder, not only high bonding strength is not obtained, but also, in the cooling step after the high-melting point metal powder is sintered in the firing step, defects attributable to strain due to a difference in thermal expansion coefficient between the sintered high-melting point metal and the sintered aluminum nitride of the substrate are liable to occur, and hence, reliability of bonding is lowered. Furthermore, in the case where a sintering auxiliary agent is not contained, not only sintering of the aluminum nitride powder contained in the composition hardly proceeds, but also sintering with aluminum nitride base (uniting) does not take place, and hence, satisfactory bonding strength cannot be obtained. In the production process of the invention, even if an active metal component, such as Ti, Zr or Hf, is not added to the composition, sufficiently high bonding strength can be obtained. Addition of such an active metal component lowers electrical conductivity of the sintered conductor layer finally obtained, so that it is preferable that the composition does not contain such an active metal component.

As the high-melting point metal powder contained in the composition, powders used in a high-melting point metal paste for use in the conventional post-fire process or co-fire process is employable, and for the reason that a fine pattern is easily formed and high bonding strength tends to be obtained, it is preferable to use powders having a mean grain diameter of 0.1 to 5 μm. Likewise, the aluminum nitride powder also preferably has a mean grain diameter of 0.1 to 5 μm. As the sintering auxiliary agent, the same compounds as mentioned in the description regarding the sintered aluminum nitride substrate are employable. Of such compounds, the same sintering auxiliary agent as contained in the sintered aluminum nitride substrate or a compound containing Y is preferably used for the reason that high bonding strength is obtained. Although the grain diameter of the sintering auxiliary agent is not specifically restricted, it is preferably small from the viewpoint of homogeneous dispersibility.

The blending quantity of the high-melting point metal powder, the aluminum nitride powder and the sintering auxiliary agent in the composition are preferably as follows from the viewpoint that high bonding strength, high reliability of bonding and high conductivity are obtained. That is to say, based on 100 parts by mass of the high-melting point metal powder, the amount of the aluminum nitride powder is preferably in the range of 1 to 10 parts by mass, particularly 2 to 8 parts by mass, and the amount of the sintering auxiliary agent is preferably in the range of 0.01 to 1.5 parts by mass, particularly 0.03 to 1 part by mass. For the reason that the electrical conductivity of the sintered conductor layer is particularly raised, the amount of the sintering auxiliary agent is most preferably in the range of 0.10 to 0.25 part by mass on the above basis. In order to raise the electrical conductivity, after an unfired conductor layer composed of the composition containing high-melting point metal powders, aluminum nitride powders and a sintering auxiliary agent is formed on a surface of the sintered aluminum nitride, an unfired conductor layer composed of a composition containing a high-melting point metal but containing no aluminum nitride powder and no sintering auxiliary agent may as well be formed on a part or the whole of the unfired conductor layer.

For forming a wiring pattern (patterning) constituted of an unfired conductor layer composed of the composition on the surface of the sintered aluminum nitride, the composition is made pasty, and is applied by, for example, a printing method to form a prescribed pattern. For making the composition pasty, a binder, such as ethyl cellulose, nitrocellulose or an acrylic resin, a solvent, such as toluene, acetone, ethanol or terpineol, a dispersant, and if necessary, a plasticizer and the like, are added in addition to the aforesaid essential components, and they are sufficiently kneaded. In this case, the viscosity at 25° C. is preferably adjusted to 800 to 5000 P from the viewpoint of printability. Especially when patterning is carried out by screen printing or the like, the viscosity of the paste at 25° C. is preferably adjusted to 1500 to 3500 P in order to reduce blotting. As a means to apply the pasty composition onto the surface of the sintered aluminum nitride substrate to perform pattering, not only screen printing but also metal mask printing, Bubble Jet (trademark) printing, transfer method or the like is employable.

The shape of the wiring pattern to be formed is not specifically restricted, and it has only to be properly determined according to desire for the substrate. In the pattern formation, for example in the case where a substrate having a through-hole (perforation) was used as the substrate, the through-hole may be filled with the paste. According to the production process of the invention, baking of a pattern can be carried out with a high bonding strength while maintaining the shape of each wiring pattern unit and the relative positional relationship between the wiring pattern units even after the sintering step in the case where an intermediate material substrate having plural wiring pattern units on its surface is used. On this account, the production process of the invention is particularly preferable as a process for producing a multiple-piece-forming substrate for forming a large number of metallized substrate chips (e.g., substrates for mounting semiconductor devices) in each of which one wiring pattern unit is formed on a surface of an extremely small substrate of several mm square.

For producing the above-mentioned multiple-piece-forming substrate, it is preferable that a wiring pattern unit is designed to electrically connect to a wiring pattern unit adjacently arranged as shown in FIG. 2, from the viewpoint of efficiency in production of substrate chips. FIG. 2 is an example of a wiring pattern (wiring pattern unit) formed in one substrate chip, and in the wiring pattern unit 5, unfired conductor layers 4 and 4' for electrodes which have the same shapes and are not electrically connected to each other (this means that they are not electrically connected when the substrate is cut into pattern units) are formed on a surface of a sintered aluminum nitride substrate 3, and the wiring pattern unit 5 has unfired conductor layers 401 and 401' which become ports for electrically connecting the neighboring electrodes to each other when the wiring pattern units are laterally arranged. By taking such a structure, plating of all the wiring pattern units at a time becomes-possible after completion of the firing step. It is very troublesome to perform plating of individual substrate chips after completion of the firing step and cutting is performed to separate the substrate into substrate chips, so from the viewpoint of production efficiency, it is preferable that plating is performed and then cutting is performed. In order to perform plating at a time through electroplating, however, the metallization layers to be subjected to plating need to be electrically connected to each other. In this case, it is preferable to form a tie bar pattern 402 (pattern of different shape from that of wiring pattern unit) for playing a role of a tie bar for the plating treatment at the periphery of the intermediate material substrate 6, as shown in FIG. 3. Further, it is also possible to form a notch 301 for hanging a plating rack, as shown in FIG. 3.

From the viewpoint of efficiency in production of substrate chips, the number of wiring pattern units formed on one multiple-piece-forming substrate is preferably as large as possible. Further, it is preferable to arrange the wiring pattern units in the form of a lattice, as shown in FIG. 3. By virtue of such arrangement, it becomes possible to separate the substrate chips from one another by linear cutting. In the case where a multiple-piece-forming substrate is produced by the process of the invention, therefore, it is preferable to arrange one or more rows, particularly 10 or more rows, in each of which 5 or more, particularly 10 or more wiring pattern units of substantially the same shapes are arranged in one direction (usually in the vertical (longitudinal) direction or the horizontal (lateral) direction). In the pattern formation, it is most preferable to arrange plural wiring pattern units having quite the same shapes as one another. However, the shapes of the pattern units are inevitably changed slightly from one another even if the same shapes are intended as a result of the limitations of the paste coating method (e.g., printing technique). Therefore, the expression "wiring pattern units of substantially the same shapes" used herein means that the shapes of the pattern units are the same as one another except for such inevitable deformation.

In order to form a pattern having one or more rows, particularly 10 or more rows, in each of which 5 or more, particularly 10 or more wiring pattern units of substantially the same shapes are arranged, as described above, the pattern array tolerance defined below is preferably made as small as possible. The pattern array tolerance is defined as a maximum value of the shortest distances between a reference point of wiring pattern units and a reference line, said maximum value being obtained by deciding one arbitrary point present inside a wiring pattern unit as a reference point, then taking, as a reference line, a linear line between reference points of wiring pattern units located at both ends of each row of all the "rows in each of which 5 or more wiring pattern units are orderly arranged" present on a substrate, then determining the shortest distance between the reference points of each wiring pattern unit of all the wiring pattern units belonging to each row and the reference line, and finding a maximum value of the shortest distance. In the case where the pattern array tolerance exceeds 10 μm, a part of the wiring pattern units are damaged by linear cutting of the substrate unless intervals between the wiring pattern units are widened. When the width of the wiring pattern unit is enlarged, it becomes necessary to file each substrate chip into a desired shape after the substrate chips are cut out. In order to remove such an adverse effect, the pattern array tolerance is made preferably not more than 10 μm, more preferably not more than 8 μm, most preferably not more than 5 μm, in the above case. By adopting the aforesaid coating method, the pattern array tolerance can be easily made not more than 10 μm, and by forming a pattern through, for example, screen printing, the pattern array tolerance can be made not more than 5 μm.

The pattern tolerance is described in more detail hereinafter with reference to the attached drawings. FIG. 4 is a schematic view to explain a pattern tolerance about a row in which 3 or more wiring pattern units are laterally connected. In FIG. 4, only wiring pattern units at both ends of a row and one wiring pattern unit in the vicinity of the center of the row are shown to explain the array tolerance simply (in fact, 3 or more wiring pattern units are continuously connected). In order to determine the pattern array tolerance, a reference point 7 of a wiring pattern unit needs to be decided. The reference point 7 can be decided at an arbitrary point provided that it is present inside the wiring pattern unit, as shown in FIG. 2, and for example, it can be decided at an arbitrary point $(x_1, y_1)$ in the case where an x axis and a y axis that meets at right angles to the x axis are set in each wiring pattern unit. The wiring pattern units present in a row have substantially the same shapes, so that the reference point in each wiring pattern unit is a point, coordinate of which is $(x_1, y_1)$ on the coordinate system of the wiring pattern unit. Next, a reference line 8 is drawn between reference points 7a and 7b of two wiring pattern units that are located at both ends of the row. Then, the shortest distances d between the reference points 7 of all the wiring pattern units in the row and the reference line 8 are determined, and of the shortest distances d, a maximum value $d_{max}$ is a pattern array tolerance. In FIG. 4, the shortest distance d between the reference point 7c of the wiring pattern unit at the center of the row and the reference line 8 becomes maximum, so that this distance d (μm) is a pattern array tolerance. When plural rows are present in the substrate, the shortest distances of the reference points 7 and the reference line 8 are determined about all the rows, and of all the shortest distances, a maximum value is a pattern array tolerance. For example, in case of an intermediate material substrate 6 shown in FIG. 3 (in this substrate, 5 rows, in each of which 5 wiring pattern units shown in FIG. 2 are laterally connected, are longitudinally arranged in parallel to one another), the shortest distances between the reference points 7 and the reference line 8 are determined about all the 5 rows, and of the shortest distances thus determined, a maximum value is a pattern array tolerance. The concept of the pattern array tolerance of the intermediate material substrate is the same as that of the finally obtained metallized substrate, except that the layer to constitute the wiring pattern unit is changed to a sintered conductor layer from the unfired conductor layer.

After patterning is carried out as above, the pasty composition is dried to remove the solvent, and then degreasing treatment is carried out when needed, whereby an intermediate material substrate can be obtained. The drying has to be carried out, for example, in air at 60 to 120° C. for about 1 to 20 minutes. Even if the degreasing treatment after the drying is omitted, an organic component contained in the unfired conductor layer is removed in the subsequent firing step. Therefore, the degreasing treatment does not necessarily have to be carried out before the firing step.

In the production process of the invention, the intermediate material substrate preparation step is followed by a firing step. In this firing step, the intermediate material substrate prepared in the intermediate material substrate preparation step is fired to sinter the unfired conductor layer, whereby a metallized aluminum nitride substrate is obtained. In order to obtain high bonding strength, it is necessary to carry out firing with inhibiting volatilization of the sintering auxiliary agent contained in the unfired conductor layer. If firing is carried out without controlling the atmosphere in the vicinity of the unfired conductor layer and carried out under such conditions that the sintering auxiliary agent in the unfired conductor layer is easily volatilized to the outside, the aluminum nitride dispersed in the unfired conductor layer and the aluminum nitride of the substrate cannot be sintered together by firing, and hence, high bonding strength cannot be obtained.

The method to inhibit volatilization of the sintering auxiliary agent contained in the unfired conductor layer during the firing is not specifically restricted provided that it is a method of increasing a partial pressure of the sintering auxiliary agent vapors contained in the atmosphere in the vicinity of the unfired conductor layer during the firing, more specifically, a method of feeding vapors of the sintering auxiliary agent to the vicinity of the unfired conductor layer from the outside. For example, a method wherein firing is carried out while placing a material that is a feed source of the sintering auxiliary agent vapors in the vicinity (location at a distance of not more than 10 mm, preferably not more than 1 mm, from the substrate) of the intermediate material substrate that is a firing target can be preferably adopted. From the viewpoints of simplicity of operation and effect, it is particularly preferable to carry out firing while bringing "sintered aluminum nitride obtained by sintering using a same kind of sintering auxiliary agent contained in the unfired conductor layer" (also referred to as an "atmosphere-controlling sintering product" hereinafter) into contact with an exposed surface of the unfired conductor layer or placing it in the vicinity of the exposed surface (location at a distance of not more than 10 mm, preferably not more than 1 mm, from the exposed surface).

Although the atmosphere-controlling sintering product used herein is not specifically restricted provided that it is a sintered aluminum nitride body obtained by sintering using a the same kind of sintering auxiliary agent contained in the unfired conductor layer, it is preferable to use a substrate obtained by sintering a mixture of 100 parts by mass of aluminum nitride powders and 1 to 20 parts by mass, preferably 3 to 10 parts by mass, of a sintering auxiliary agent. Although the atmosphere-controlling sintering product may be placed on the unfired conductor layer or may be placed above the unfired conductor layer slightly apart from the unfired conductor layer, the former is preferable from the viewpoint of effect. In this case, the exposed surface of the unfired conductor layer and the atmosphere-controlling sintering product contact with each other, but when the atmosphere-controlling sintering product is just placed without particularly applying a load, the conductor layer and the atmosphere-controlling sintering product are not firmly fixed to each other, and they can be easily separated after completion of the firing step.

In the firing step, firing is preferably carried out by keeping the intermediate material substrate in a non-oxidizing atmosphere at a temperature of 1700 to 1900° C. for not shorter than 30 minutes (e.g., 0.5 to 24 hours), and is more preferably carried out by keeping the intermediate material substrate in a non-oxidizing atmosphere at a temperature of 1750 to 1850° C. for not shorter than 0.5 hour (e.g., 0.5 to 24 hours, particularly 1 to 10 hours). If the firing temperature is too low, a liquid phase cannot be sufficiently formed in the conductor layer, so that high bonding strength cannot be obtained. If the firing temperature is too high, it is difficult to inhibit volatilization of the sintering auxiliary agent in the conductor layer. The atmosphere in the firing is not specifically restricted provided that it is a non-oxidizing atmosphere of nitrogen, hydrogen or the like. However, if a large amount of carbon is contained in the atmosphere, volatilization of a sintering auxiliary agent containing Y or the like is accelerated, so, when an oven using carbon as an refractory lining is used, it is preferable to avoid contamination of the atmosphere with carbon from the refractory lining. For this reason, firing is preferably carried out while the intermediate material substrate is placed in a container made of aluminum nitride or boron nitride in the firing step. This container preferably has such a structure as is capable of maintaining a pressure equal to that of the outside. By virtue of such a structure, thermal decomposition of the organic component takes place at low temperatures of such as 400 to 500° C. even if degreasing of the unfired conductor layer is carried out simultaneously with firing, and hence, influence in the firing can be removed by allowing a non-oxidizing gas to flow outside the container.

After completion of the firing step, the substrate is cooled and then taken out, and if necessary, a conductive layer made of Ni, Ni—P, Ni—B, Au, Ag, Cu or the like may be formed on the fired conductor layer. For forming method of the conductive layer, a thin-film metallization method such as plating method (electrolytic plating method or non-electrolytic plating method) or deposition method is adoptable. By forming such a conductive layer, soldering or wire bonding can be easily carried out.

In the metallized substrate obtained by the production process of the invention, a metallization layer (sintered conductor layer) bonded to the substrate with a high bonding strength (e.g., not less than 50 MPa, preferably not less than 70 MPa) that cannot be obtained in the conventional post-fire process can be formed in spite that the metallized substrate is produced by a post-fire process. In the process of the invention, further, addition of such an active metal (e.g., Ti, Zr or Hf) as lowers electrical conductivity in order to increase bonding strength of the sintered conductor layer is unnecessary, and besides, sintering of the high-melting point metal is highly promoted. Accordingly, of the metallized substrates produced by the production process of the invention, substrates, in which any metal component of Ti, Zr and Hf is not contained in the sintered conductor layer, also have a feature that the electrical conductivity of the sintered conductor layer is particularly higher in comparison with metallization layers (even in comparison with those not containing a metal such as Ti) of substrates obtained by the conventional co-fire process.

As already explained, the reason why such effects are obtained is presumably that the aluminum nitride in the sintered conductor layer and the sintered aluminum nitride substrate are sintered with each other in the sintering step, and this is supported by the result of observation of a section of a substrate produced by the process of the invention.

In FIG. 5, a scanning electron microscope (SEM) photograph of a section (section of region containing area bonded to conductor layer) of a metallized substrate obtained by the production process of the invention (specifically, substrate obtained in Example 1) is shown, and in FIG. 6, mapping images of W and Al on the similar section as above obtained by an electron probe microanalyzer (EPMA) are shown as well. The photograph on the left-hand side in FIG. 6 shows a mapping image of W, and the area of high W concentration is white. The photograph on the right-hand side in FIG. 6 shows a mapping image of Al, and the area of high Al concentration is white.

As shown in these figures, it can be seen that in the metallized substrate obtained by the production process of the invention, the sintered conductor layer (high-melting point metal layer) has a structure wherein a sintered aluminum nitride phase is dispersed in a continuous phase composed of a sintering product of a high-melting point metal (tungsten and/or molybdenum), and in the vicinity (e.g., region within the range of ±1 μm from the interface) of the bonding interface between the sintered conductor layer (high-melting point metal layer) and the sintered aluminum nitride substrate, the aluminum nitride that constitutes the sintered aluminum nitride substrate and the aluminum nitride dispersed in the continuous phase are unified. That is to say, it can be seen that the bonding interface has a structure wherein the high-melting point metal phase and the aluminum nitride layer are indented each other. Accordingly, it is thought that high bonding strength can be obtained because strong physical bonding due to so-called anchoring effect takes place in addition to the chemical bonding.

In contrast therewith, the interfacial structure of a metallized substrate obtained in the conventional post-fire process (specifically, substrate obtained in Comparative Example 2) is as shown in FIG. 7 and FIG. 8, and it can be seen that sintering of the aluminum nitride of the substrate and the aluminum nitride in the fired conductor layer did not occur. FIG. 7 shows a SEM photograph of a substrate section (section of region containing area bonded to conductor layer), and FIG. 8 shows mapping images of W and Al on the similar section as above obtained by EPMA.

According to the production process of the invention, a bonding strength equivalent to that obtained by the co-fire process can be obtained with keeping an advantage of the post-fire process that deformation of substrate does not occur. In the case where a multiple-piece-forming substrate is produced by the production process of the invention, therefore, a multiple-piece-forming substrate having a high bonding strength of the conductor layer and having an extremely small pattern array tolerance can be efficiently produced.

According to the production process of the invention, there can be produced, for example, a multiple-piece-forming substrate comprising a "metallized aluminum nitride substrate having on its surface a wiring pattern having one or more rows arranged, in each of said rows 5 or more wiring pattern units of substantially the same shapes being orderly arranged in one direction, said wiring pattern unit comprising a conductor layer which includes a high-melting point metal layer (corresponding to sintered conductor layer) comprising at least one high-melting point metal selected from the group consisting of tungsten and molybdenum and is bonded to the sintered aluminum nitride substrate with the high-melting point metal layer, wherein the conductor layer is bonded to the sintered aluminum nitride with a bonding strength of not less than 50 MPa (5.1 kgf/mm$^2$), and the wiring pattern has a pattern array tolerance, as defined previously, of not more than 10 μm.

The bonding strength of the sintered conductor layer can be evaluated by, for example, a so-called pull strength test in which a sintered conductor layer is subjected to plating, then a metal pin having a tip of 1 mm$^2$ is soldered onto the metallization surface using a Pb—Sn solder, and the soldered metal pin is pulled perpendicularly at a rate of 10 mm/min.

In the conventional post-fire process, the aforesaid requirement of the pattern array tolerance can be satisfied, but the aforesaid requirement of the bonding strength cannot be satisfied. In the conventional co-fire process, the aforesaid requirement of the bonding strength can be satisfied, but the aforesaid requirement of the pattern array tolerance cannot be satisfied.

By cutting the multiple-piece-forming substrate along boundaries of the wiring pattern units, metallized substrate chips each of which has one wiring pattern unit on the surface are produced, and in this case, cutting is generally carried out linearly using a cutting blade containing diamond. In the case where the multiple-piece-forming substrate has many wiring pattern units and has a large pattern array tolerance, therefore, a part of the pattern is damaged in the cutting, and the yield is lowered. The aforesaid multiple-piece-forming substrate has a small pattern array tolerance and has a high bonding strength of the conductor layer, so that when such a multiple-piece-forming substrate is used, chips having high reliability of metallization can be produced in a high yield. From the viewpoint that metallized substrate chips of high quality can be produced, the multiple-piece-forming substrate produced by the production process of the invention is preferably a "substrate which has a wiring pattern composed of 5 to 200 rows arranged, particularly 10 to 50 rows arranged, in each of said rows 5 to 200 wiring pattern units of substantially the same shapes, particularly 10 to 50 wiring pattern units of substantially the same shapes, being orderly arranged in one direction and in which the conductor layer has a bonding strength of 50 to 120 MPa, particularly 70 to 100 MPa".

The present invention is further described with reference to the following examples, but it should be construed that the invention is in no way limited to those examples.

Example 1

100 Parts by mass of tungsten powders having a mean grain diameter of 2.5 μm, 3 parts by mass of aluminum nitride powders having a mean grain diameter of 1.5 μm, 0.15 part by mass of yttrium oxide powders having a mean grain diameter of 0.5 μm, 2 parts by mass of ethyl cellulose and 10 parts by mass of terpineol were kneaded to prepare a high-melting point metal paste having a viscosity at 25° C. of 3000 P. Then, the paste was applied by printing onto a substrate which had been obtained by polishing (thickness of the substrate after polishing: 0.3 mm) a surface of a sintered aluminum nitride substrate (□50 mm) containing 5 parts by weigh of yttrium oxide so as to have a surface roughness Ra of 0.03 μm (so-called mirror finish,), to form a pattern in which such wiring pattern units (□4 mm) as shown in FIG. 2 were arranged 10 units each longitudinally and laterally in the form of a lattice. Thereafter, the pattern was dried at 60° C. for 10 minutes to obtain an intermediate material substrate. The thickness of the pattern after drying was 15 μm.

On the intermediate material substrate obtained as above, a sintered aluminum nitride substrate (□56 mm, thickness: 0.6 mm), which is functioning as atmosphere-controlling substrate and obtained by sintering using 5 parts by weight of yttrium oxide, was placed so as to be brought into contact with the surface of the patterns, followed by firing at 1810° C. for 4 hours in a nitrogen gas.

The electrical resistivity of the resulting metallized substrate at 25° C., which was measured based on the resistance in the region of a width of 1.5 mm and a length of 3.5 mm by the use of a four-terminal method and a metallization film thickness, was $2.1 \times 10^{-7}$ Ω·m. Then, Ni/Au was deposited on the metallized substrate by an electrolytic plating process, and measurements of a bonding strength (adhesion strength) of the metallization layer and a pattern array tolerance were carried out. The bonding strength of the metallization layer was evaluated by a pull strength test in which a metal pin having a tip of 1 mm$^2$ was soldered with a Pb—Sn solder onto the metallization layer obtained after plating, and the soldered metal pin was pulled perpendicularly at a rate of 10 mm/min to measure a strength at the time the pin was separated. As a result, the bonding strength was 76 MPa, and the pattern array tolerance was 4 μm.

Example 2

A metallized substrate was prepared in the same manner as in Example 1, except that the firing conditions were changed to 1810° C. and 1 hour. The resulting substrate was subjected to the same evaluation as in Example 1. The results are set forth in Table 1.

Example 3

A metallized substrate was prepared in the same manner as in Example 1, except that a substrate containing no auxiliary agent was used as the sintered aluminum nitride substrate on which the high-melting point metal paste was to be printed. The resulting substrate was subjected to the same evaluation as in Example 1. The results are set forth in Table 1.

Example 4

A metallized substrate was prepared in the same manner as in Example 1, except that the amounts of the tungsten powder, the aluminum nitride powder and the yttrium oxide powder contained in the high-melting point metal paste were changed to 100 parts by mass, 8 parts by mass and 0.4 part by mass, respectively. The resulting substrate was subjected to the same evaluation as in Example 1. The results are set forth in Table 1.

Example 5

A metallized substrate was prepared in the same manner as in Example 1, except that a substrate containing no auxiliary agent was used as the sintered aluminum nitride substrate on which the high-melting point metal paste was to be printed and that the firing conditions were changed to 1,750° C. and 4 hours. The resulting substrate was subjected to the same evaluation as in Example 1. The results are set forth in Table 1.

Comparative Example 1

Example of Co-fire Process

On a surface of an aluminum nitride green sheet (□50 mm, thickness: 0.6 mm) containing 5 parts by mass of yttrium oxide as a sintering auxiliary agent based on 100 parts by mass of the aluminum nitride powder, a pattern was formed in the same manner as in Example 1. Subsequently, the pattern was dried at 60° C. for 10 minutes and then maintained at 900° C. for 1 hour in a hydrogen atmosphere containing moisture to perform degreasing. Thereafter, the degreased body was fired at 1810° C. for 4 hours in a nitrogen atmosphere to obtain a metallized substrate. The resulting substrate was subjected to the same evaluation as in Example 1. The results are set forth in Table 1.

Comparative Example 2

A metallized substrate was prepared in the same manner as in Example 1, except that the atmosphere-controlling substrate was not used when the intermediate material substrate was fired. The resulting substrate was subjected to the same evaluation as in Example 1. The results are set forth in Table 1.

Comparative Example 3

A metallized substrate was prepared in the same manner as in Example 5, except that a substrate composed of sintered aluminum nitride containing no yttrium oxide was used instead of the atmosphere-controlling substrate, and that the firing conditions were changed to 1,750° C. and 4 hours. The resulting substrate was subjected to the same evaluation as in Example 5. The results are set forth in Table 1.

TABLE 1

| No. | Sintered AlN substrate; Sintering auxiliary agent and amount added | High-melting point metal paste | | | Firing conditions | | | | Evaluation results | | |
|---|---|---|---|---|---|---|---|---|---|---|---|
| | | W powder (part(s) by mass) | AlN powder (part(s) by mass) | Yttria (part(s) by mass) | Firing process | Atmosphere control | Firing temperature (° C.) | Firing time (hr(s)) | Resistivity ($\Omega \cdot m$) | Pattern array tolerance (μm) | Bonding power (MPa) |
| Example 1 | yttria (5 parts by mass) | 100 | 3 | 0.15 | post-fire | done | 1810 | 4 | $2.1 \times 10^{-7}$ | 4 | 76 |
| Example 2 | yttria (5 parts by mass) | 100 | 3 | 0.15 | post-fire | done | 1810 | 1 | $2.5 \times 10^{-7}$ | 3 | 87 |
| Example 3 | none | 100 | 3 | 0.15 | post-fire | done | 1810 | 4 | $2.6 \times 10^{-7}$ | 4 | 59 |
| Example 4 | yttria (5 parts by mass) | 100 | 8 | 0.4 | post-fire | done | 1810 | 4 | $5.1 \times 10^{-7}$ | 3 | 70 |
| Example 5 | none | 100 | 3 | 0.15 | post-fire | done | 1750 | 4 | $2.3 \times 10^{-7}$ | 3 | 60 |
| Comparative Example 1 | yttria (5 parts by mass) | 100 | 3 | 0.15 | co-fire | none | 1810 | 4 | $2.0 \times 10^{-7}$ | 70 | 74 |
| Comparative Example 2 | yttria (5 parts by mass) | 100 | 3 | 0.15 | post-fire | none | 1810 | 4 | $4.8 \times 10^{-7}$ | 5 | 20 |
| Comparative Example 3 | none | 100 | 3 | 0.15 | post-fire | none | 1750 | 4 | $3.8 \times 10^{-7}$ | 3 | 28 |

In Examples 1 to 5 in which the production process of the invention was adopted as shown in Table 1, a metallized substrate having a high bonding strength of the metallization layer and having a small pattern array tolerance could be obtained. In contrast therewith, in the metallized substrate obtained in Comparative Example 1 adopting the co-fire process, the pattern array tolerance was large though the bonding strength of the metallization layer was high. In the metallized substrates obtained in Comparative Example 2 and Comparative Example 3 in which atmosphere control was not carried out though the post-fire process was adopted, the bonding strength of the metallization layer was low though the pattern array tolerance was small. Further, when Example 1 and Comparative Example 2 were compared, the metallization layer of Example 1 had a smaller electrical resistivity and a higher electrical conductivity.

The invention claimed is:

1. A process for producing a metallized aluminum nitride substrate, comprising an intermediate material substrate preparation step for preparing a sintered aluminum nitride substrate having on its surface a layer composed of a composition comprising 100 parts by mass of at least one kind of high-melting point metal powder selected from the group consisting of tungsten powders and molybdenum powders, 1 to 10 parts by mass of aluminum nitride powders and 0.03 to 1 part by mass of a sintering auxiliary agent for aluminum nitride which consists of a compound containing Y, and a firing step for firing the substrate prepared in the previous step to sinter the layer, wherein in the firing step, firing is carried out such that volatilization of the sintering auxiliary agent contained in the composition is inhibited by increasing a partial pressure of sintering auxiliary agent vapors contained in an atmosphere in a vicinity of the layer during firing.

2. A process for producing a metallized aluminum nitride substrate, comprising an intermediate material substrate preparation step for preparing a sintered aluminum nitride substrate having on its surface a layer composed of a composition comprising 100 parts by mass of at least one kind of high-melting point metal powder selected from the group consisting of tungsten powders and molybdenum powders, 1 to 10 parts by mass of aluminum nitride powders and 0.03 to 1 part by mass of a sintering auxiliary agent for aluminum nitride which consists of a compound containing Y, and a firing step for firing the substrate prepared in the previous step to sinter the layer, wherein in the firing step, firing is carried out while an atmosphere controlling sintering product is brought into contact with an exposed surface of the layer or placed in the vicinity of the exposed surface and wherein the atmosphere controlling sintering product comprises a second sintered aluminum nitride substrate comprising using a same kind of sintering auxiliary agent contained in the composition.

3. The process as claimed in claim 1, wherein in the firing step, firing is carried out by maintaining the substrate prepared in the intermediate material substrate preparation step at a temperature of 1700 to 1900° C. for not shorter than 30 minutes.

4. The process as claimed in claim 1, further comprising a step for forming a layer composed of a metal other than tungsten and molybdenum on the layer that has been sintered in the firing step.

5. The process as claimed in claim 1, wherein the layer formed on the surface of the intermediate material substrate constitutes a wiring pattern in which plural wiring pattern units having substantially the same shapes are regularly arranged.

6. The process as claimed in claim 2, wherein in the firing step, firing is carried out by maintaining the substrate prepared in the intermediate material substrate preparation step at a temperature of 1700 to 1900° C. for not shorter than 30 minutes.

7. The process as claimed in claim 2, further comprising a step for forming a layer composed of a metal other than tungsten and molybdenum on the layer that has been sintered in the firing step.

8. The process as claimed in claim 2, wherein the layer formed on the surface of the intermediate material substrate constitutes a wiring pattern in which plural wiring pattern units having substantially the same shapes are regularly arranged.

* * * * *

UNITED STATES PATENT AND TRADEMARK OFFICE
CERTIFICATE OF CORRECTION

| | |
|---|---|
| PATENT NO. | : 7,993,699 B2 |
| APPLICATION NO. | : 11/667603 |
| DATED | : August 9, 2011 |
| INVENTOR(S) | : Yasuyuki Yamamoto |

It is certified that error appears in the above-identified patent and that said Letters Patent is hereby corrected as shown below:

Column 16, Line 52, Claim 2, after "comprising" delete "using"

Signed and Sealed this
Twenty-second Day of November, 2011

David J. Kappos
*Director of the United States Patent and Trademark Office*